(12) United States Patent
Lee et al.

(10) Patent No.: US 12,527,210 B2
(45) Date of Patent: Jan. 13, 2026

(54) DISPLAY DEVICE

(71) Applicant: Samsung Display Co., Ltd., Yongin-si (KR)

(72) Inventors: Hongyeon Lee, Suwon-si (KR); Ohjeong Kwon, Hwaseong-si (KR); Seungyeon Jeong, Hwaseong-si (KR); Hyeoji Kang, Seoul (KR); Taeho Kim, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 544 days.

(21) Appl. No.: 17/970,455

(22) Filed: Oct. 20, 2022

(65) Prior Publication Data

US 2023/0209877 A1    Jun. 29, 2023

(30) Foreign Application Priority Data

Dec. 23, 2021   (KR) .................. 10-2021-0185794

(51) Int. Cl.
  *H01L 51/52*   (2006.01)
  *H10K 59/122*  (2023.01)
  *H10K 59/80*   (2023.01)

(52) U.S. Cl.
  CPC ......... *H10K 59/879* (2023.02); *H10K 59/122* (2023.02); *H10K 59/8792* (2023.02); *H10K 59/873* (2023.02)

(58) Field of Classification Search
  CPC .. H10K 50/858; H10K 50/865; H10K 50/844; H10K 59/122
  See application file for complete search history.

(56) References Cited

U.S. PATENT DOCUMENTS

| | | |
|---|---|---|
| 11,108,026 B2 | 8/2021 | Kim et al. |
| 11,778,884 B2 | 10/2023 | Lee et al. |
| 2004/0155996 A1 | 8/2004 | Chen et al. |
| 2020/0144550 A1* | 5/2020 | Lee ..................... H10K 50/865 |
| 2022/0285652 A1* | 9/2022 | Sim ....................... H10K 59/12 |

FOREIGN PATENT DOCUMENTS

| | | |
|---|---|---|
| KR | 20160139987 A | 12/2016 |
| KR | 10-2018-0052912 A | 5/2018 |
| KR | 10-2020-0058154 A | 5/2020 |
| KR | 20210109716 A | 9/2021 |

* cited by examiner

*Primary Examiner* — Victor A Mandala
*Assistant Examiner* — Colleen E Snow
(74) *Attorney, Agent, or Firm* — Womble Bond Dickinson (US) LLP

(57) ABSTRACT

A display device includes a display panel, a sensor layer provided on the display panel, and a light control layer provided on the sensor layer, and including at least one of a dye or a pigment, wherein the display panel includes a base layer, a pixel-defining film provided on the base layer and having an opening defined therein, a light-emitting element including a light-emitting layer provided in the opening, an inorganic deposition layer provided on the light-emitting element, a low refractive pattern layer provided on the pixel-defining film, and an encapsulation layer provided on the low refractive pattern layer and the inorganic deposition layer, and the encapsulation layer has a higher refractive index than the low refractive pattern layer. Accordingly, due to improved light collection efficiency of the light-emitting element, the display device may have improved display efficiency.

20 Claims, 9 Drawing Sheets

DISPLAY DEVICE

CROSS-REFERENCE TO RELATED APPLICATIONS

This application claims priority to and the benefit of Korean Patent Application No. 10-2021-0185794, filed on Dec. 23, 2021, in the Korean Intellectual Property Office, the entire content of which is hereby incorporated by reference.

BACKGROUND

1. Field

One or more aspects of embodiments of the present disclosure herein relate to a display device, and for example, to a display device with improved light extraction efficiency.

2. Description of Related Art

Various display devices utilized in multimedia devices such as televisions, mobile phones, tablet computers, and/or game consoles are being developed. A display device may include one or more suitable optical functional layers to provide a user with a high-quality color image.

In some embodiments, recently, to achieve display devices that are curved display devices, rollable display devices, and/or foldable display devices, research on a thin display device is being conducted. A thin display device may be achieved by reducing the number of optical functional layers, and by including an optical functional layer having one or more suitable functions.

SUMMARY

One or more aspects of embodiments of the present disclosure are directed towards a display device having improved light extraction efficiency due to improved light collection efficiency of a light-emitting element.

One or more embodiments of the present disclosure provide a display device including a display panel, a sensor layer on the display panel, and a light control layer on the sensor layer, and including at least one of a dye or a pigment, wherein the display panel includes a base layer, a pixel-defining film on the base layer, and having an opening defined therein, a light-emitting element including a light-emitting layer in the opening, an inorganic deposition layer on the light-emitting element, a low refractive pattern layer on the pixel-defining film, and an encapsulation layer on the low refractive pattern layer and the inorganic deposition layer, and the encapsulation layer has a higher refractive index (e.g., is higher in refractive index) than the low refractive pattern layer.

In one or more embodiments, the display panel may be divided into a display region in which the light-emitting element is provided, and a non-display region adjacent thereto, the display panel may further include a spacer in the non-display region, and the low refractive pattern layer may include the same material as the spacer.

In one or more embodiments, the inorganic deposition layer may include at least one selected from the group consisting of bismuth (Bi), ytterbium (Yb), and combinations thereof.

In one or more embodiments, the light control layer may include at least one selected from the group consisting of an anthraquinone-based compound, a phthalocyanine-based compound, an azo-based compound, a perylene-based compound, a xanthene-based compound, a diimonium-based compound, a dipyrromethene-based compound, a tetraazaporphyrin-based compound, a porphyrin-based compound, a squarylium-based compound, an oxazine-based compound, a triarylmethane-based compound, a cyanine-based compound, and combinations thereof.

In one or more embodiments, the at least one of the dye or the pigment included in the light control layer may have a maximum absorption wavelength in a wavelength range of about 490 nm to about 505 nm, and about 585 nm to about 600 nm.

In one or more embodiments, the light-emitting element may further include a first electrode on the base layer, a second electrode apart from the first electrode with the light-emitting layer therebetween, a hole transport region between the first electrode and the light-emitting layer, an electron transport region between the second electrode and the light-emitting layer, and a capping layer on the second electrode.

In one or more embodiments, a part of the capping layer may be on the pixel-defining film, and the low refractive pattern layer may be directly on the capping layer.

In one or more embodiments, a part of the second electrode may be on the pixel-defining film, and the low refractive pattern layer may be directly on the second electrode.

In one or more embodiments, the low refractive pattern layer may be directly on the pixel-defining film.

In one or more embodiments, a part of the inorganic deposition layer may be on the pixel-defining film, and the low refractive pattern layer may be directly on the inorganic deposition layer.

In one or more embodiments, an angle between a side surface of the pixel-defining film and an upper surface of the base layer may be about 60° to about 85°, and the pixel-defining film may have a thickness of about 1.5 μm to about 2 μm.

In one or more embodiments, an angle between a side surface of the low refractive pattern layer and an upper surface of the base layer may be about 70° to about 88°, and the low refractive pattern layer may have a thickness of about 3 μm to about 4.5 μm.

In one or more embodiments, the encapsulation layer may include at least one organic encapsulation layer, and the organic encapsulation layer may have a higher refractive index (e.g., is higher in refractive index) than the low refractive pattern layer.

In one or more embodiments, the difference between a refractive index of the organic encapsulation layer and a refractive index of the low refractive pattern layer (e.g., the difference in their refractive indices) may be about 0.1 or more.

In one or more embodiments, the low refractive pattern layer may have a refractive index of about 1.45 to about 1.65, and the encapsulation layer may have a refractive index of about 1.75 to about 2.

In one or more embodiments, the sensor layer may include a sensor base layer on the encapsulation layer, a first conductive layer on the sensor base layer, an inorganic insulating layer on the first conductive layer, a second conductive layer on the inorganic insulating layer, and an organic insulating layer on the second conductive layer, and the first conductive layer and the second conductive layer may each overlap the pixel-defining film in a plan view.

In one or more embodiments of the present disclosure, a display device includes a display panel, and a light control layer on the display panel, and including at least one of a dye or a pigment, wherein the display panel includes a base layer, a pixel-defining film on the base layer, and having an opening defined therein, a light-emitting element including a light-emitting layer in the opening, an inorganic deposition layer on the light-emitting element, a low refractive pattern layer on the pixel-defining film, and an encapsulation layer on the low refractive pattern layer and the inorganic deposition layer, an angle between a side surface of the pixel-defining film and an upper surface of the base layer is about 60° to about 85°, and an angle between a side surface of the low refractive pattern layer and an upper surface of the base layer is about 70° to about 88°.

In one or more embodiments of the present disclosure, a display device includes a display panel, and a sensor layer on the display panel, wherein the display panel includes a base layer, a pixel-defining film on the base layer, and having an opening defined therein, a light-emitting element including a light-emitting layer in the opening, a low refractive pattern layer on the pixel-defining film, and an encapsulation layer on the low refractive pattern layer, the encapsulation layer has a higher refractive index than the low refractive pattern layer, and an angle between a side surface of the low refractive pattern layer and an upper surface of the base layer is about 70° to about 88°.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain principles of the present disclosure. In the drawings.

DETAILED DESCRIPTION

Figure 1:
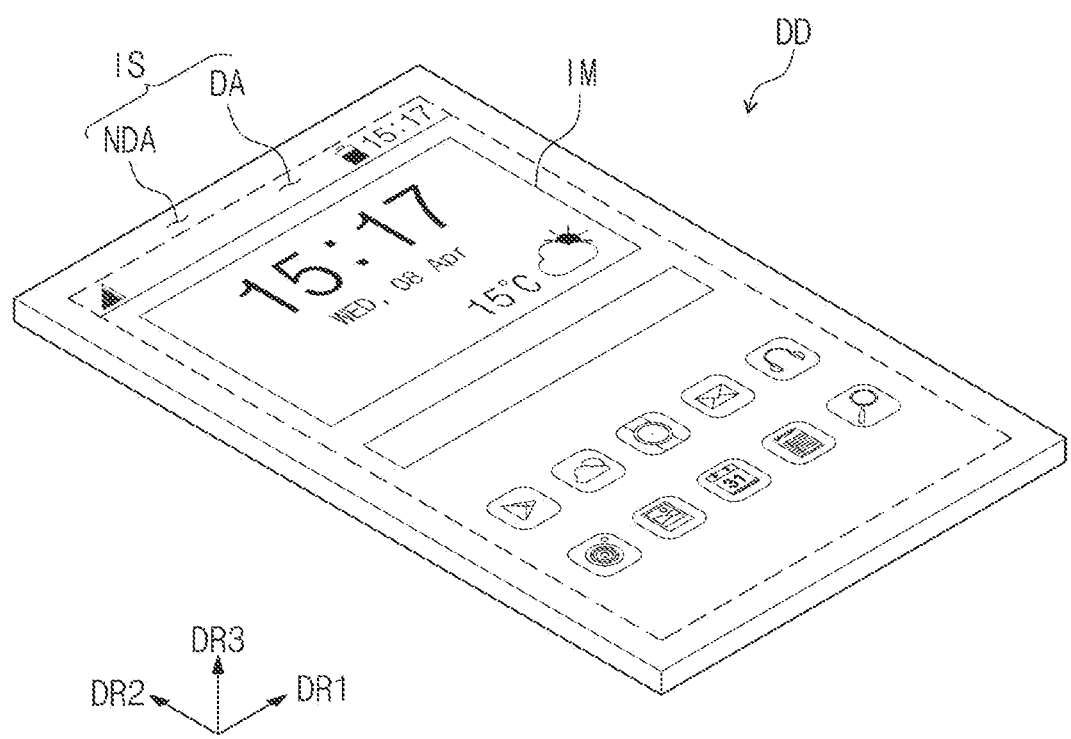
FIG. 1 is a perspective view of a display device according to one or more embodiments of the present disclosure.

Hereinafter, embodiments of the present disclosure will be described with reference to the drawings.

In this specification, when a component (or region, layer, portion, etc.) is referred to as "on", "connected", or "coupled" to another component, it may mean that it is placed/connected/coupled directly on the other component or a third component can be provided between them.

The same reference numerals or symbols refer to the same elements. In some embodiments, in the drawings, thicknesses, ratios, and dimensions of components are exaggerated for effective description of technical content. "And/or" includes all combinations of one or more that the associated elements may define.

As used herein, expressions such as "at least one of", "one of", and "selected from", when preceding a list of elements, modify the entire list of elements and do not modify the individual elements of the list. For example, "at least one selected from a, b and c", "at least one of a, b or c", and "at least one of a, b and/or c" may indicate only a, only b, only c, both (e.g., simultaneously) a and b, both (e.g., simultaneously) a and c, both (e.g., simultaneously) b and c, all of a, b, and c, or variations thereof.

Further, the use of "may" when describing embodiments of the present disclosure refers to "one or more embodiments of the present disclosure."

Terms such as first and second may be utilized to describe various components, but the components should not be limited by the terms. These terms are only utilized for the purpose of distinguishing one component from other components. For example, without departing from the scope of the present disclosure, a first component may be referred to as a second component, and similarly, a second component may be referred to as a first component. Singular expressions include plural expressions unless the context clearly indicates otherwise.

In some embodiments, terms such as "below", "lower", "above", and "upper" are utilized to describe the relationship between components shown in the drawings. The terms are relative concepts and are described based on the directions indicated in the drawings.

Terms such as "include" or "have" are intended to designate the presence of a feature, number, step, action, component, part, or combination thereof described in the specification, and it should be understood that it does not preclude the possibility of presence or addition of one or more other features, numbers, steps, operations, components, parts, or combinations thereof.

In the present disclosure, "directly provided" may mean that there is no layer, film, region, plate, etc. added between a portion such as a layer, film, region, or plate and another portion directly provided thereon. For example, "directly provided" may refer to placing two layers or two members without utilizing an additional member such as an adhesive member therebetween.

Unless otherwise defined, all terms (including technical and scientific terms) utilized in this specification have the same meaning as commonly understood by one of ordinary skill in the art to which this disclosure belongs. In addition, terms such as terms defined in commonly utilized dictionaries should be interpreted as having a meaning consistent with the meaning having in the context of the related technology, and should not be interpreted as too ideal or too formal unless explicitly defined here.

As used herein, the terms "substantially", "about", and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Hereinafter, a display device according to one or more embodiments of the present disclosure will be described with reference to the drawings.

FIG. 1 is a perspective view of a display device according to one or more embodiments of the present disclosure. FIG. 1 exemplarily illustrates a portable electronic device as a display device DD. However, the display device DD may be utilized in not only a large-sized electronic device such as a television, a monitor, and/or an external billboard, but also a small- and medium-sized electronic device such as a personal computer, a notebook computer, a personal digital terminal, a car navigation unit, a game console, a smartphone, a tablet computer, and/or a camera. However, these are presented only as examples, and the display device DD may be also employed in other electronic devices without departing from the spirit of the present disclosure.

Also, an electronic device and/or any other relevant devices or components according to embodiments of the present invention described herein may be implemented utilizing any suitable hardware, firmware (e.g. an application-specific integrated circuit), software, or a combination of software, firmware, and hardware. For example, the various components of the device may be formed on one integrated circuit (IC) chip or on separate IC chips. Further, the various components of the device may be implemented on a flexible printed circuit film, a tape carrier package (TCP), a printed circuit board (PCB), or formed on one substrate. Further, the various components of the device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the embodiments of the present disclosure.

The display device DD may have a hexahedron shape having a thickness in a third direction DR3 on a plane defined by a first direction DR1 and a second direction DR2. However, this is illustrated as an example, and the display device DD may have one or more suitable shapes, and is not limited to any one embodiment.

In one or more embodiments, the upper surface (or front surface) and the lower surface (or rear surface) of each member are defined on the basis of a direction in which an image IM is displayed. The upper surface and the lower surface are opposed to each other (e.g., are facing oppositely away from each other) in the third direction DR3, and a normal direction to each of the upper surface and the lower surface may be parallel (or substantially parallel) to the third direction DR3.

In some embodiments, directions indicated by the first to third directions DR1, DR2, and DR3 are relative concepts, and may be changed to another direction.

The display device DD may display the image IM through a display surface IS. The display surface IS includes a display region DA on which the image IM is displayed and a non-display region NDA adjacent to the display region DA. The non-display region NDA is a region on which an image is not displayed. The image IM may be a dynamic image and/or a static image. FIG. 1 illustrates a plurality of application icons and a clock widget as an example of the image IM.

The display region DA may be a quadrilateral shape. The non-display region NDA may surround the display region DA. However, this is an example, and embodiments of the present disclosure are not limited thereto. The shapes of the display region DA and the non-display region NDA may be relatively suitably designed. In some embodiments, the non-display region NDA may not exist (e.g., may not be provided) on the front surface of the display device DD.

The display device DD may be flexible. This refers to bendable characteristics, and the display device may include structures with any suitable degree of bendability, from a completely foldable structure to a structure that may be bent to the level of several nanometers. For example, the display device DD may be a curved display device and/or a foldable display device. However, embodiments of the present disclosure are not limited thereto, and the display device DD may be rigid.

Figure 2:
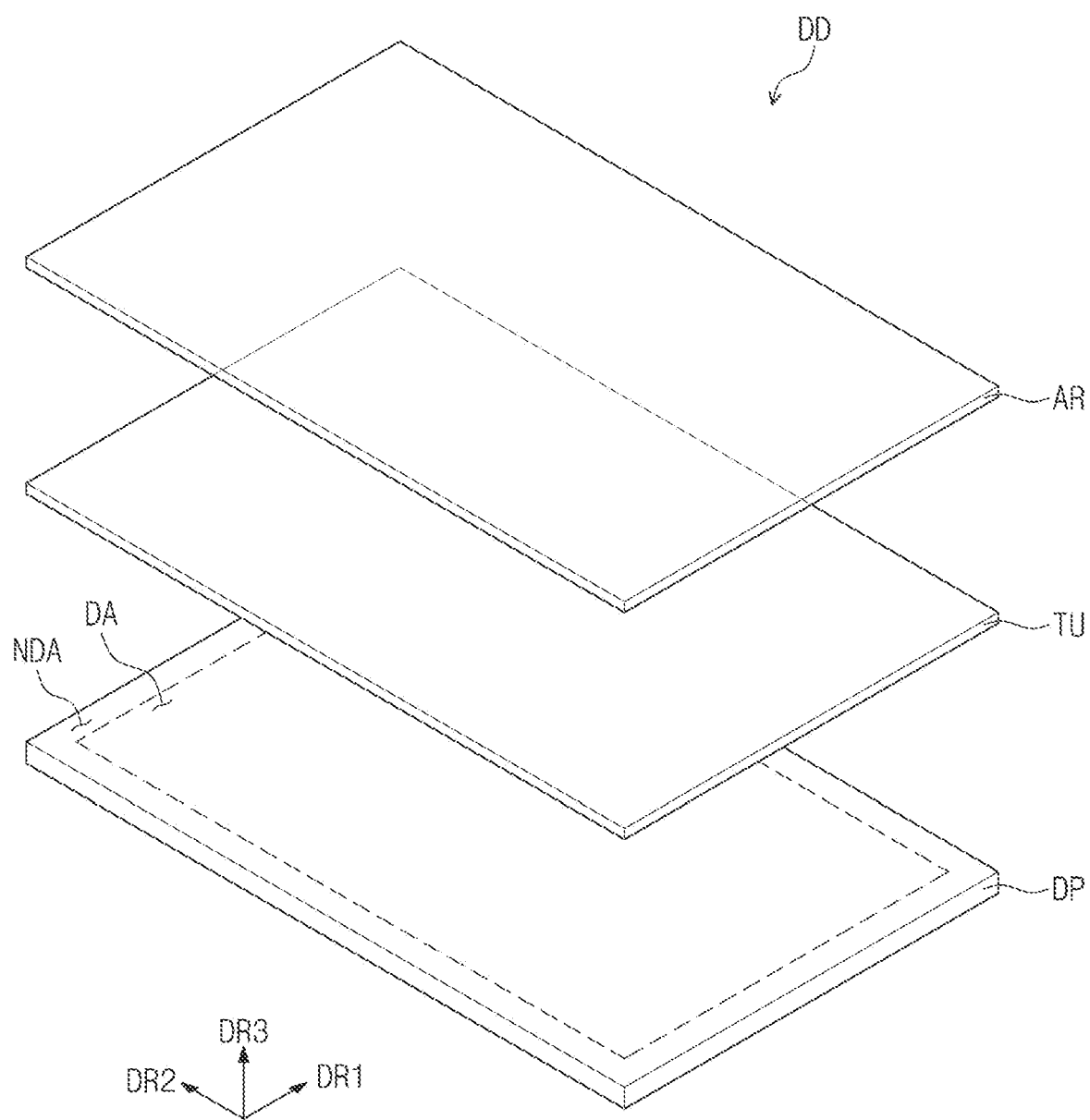
FIG. 2 is an exploded perspective view of a display device according to one or more embodiments of the present disclosure.

FIG. 2 is an exploded perspective view of a display device according to one or more embodiments of the present disclosure. Referring to FIG. 2, a display device DD according to one or more embodiments may include a display panel DP, a sensor layer TU, and a light control layer AR, which are sequentially stacked along the third direction DR3.

The display panel DP may include a plurality of pixels in a region corresponding to the display device DD. The plurality of pixels may correspond to a plurality of light-emitting regions PXA-R, PXA-G, and PXA-B (see FIG. 3). The plurality of pixels may display light in response to an electric signal. Due to the plurality of pixels, a display region DA may display an image IM generated by light.

The display panel DP according to one or more embodiments may be a self-luminous display panel. For example, the display panel DP may be a micro LED display panel, a nano LED display panel, an organic light-emitting display panel, or a quantum dot display panel. However, this is only an example, and as long as the display panel DP is a self-luminous display panel, the display panel DP is not limited thereto.

A light-emitting layer of an organic light-emitting display panel may include an organic light-emitting material. A light-emitting layer of a quantum dot light-emitting display panel may include a quantum dot, a quantum rod, and/or the like. A micro LED display panel may include a micro light-emitting diode element which is an ultra-small light-emitting element, and a nano LED display panel may include a nano light-emitting diode element. Hereinafter, the display panel DP is described as an organic light-emitting display panel.

The light control layer AR may be provided on the display panel DP. The light control layer AR may be an antireflective layer which reduces reflectance of external light incident from the outside. The light control layer AR may be a layer which selectively transmits light emitted from the display panel DP. The light control layer AR may not include (e.g., may exclude) a polarization layer. Accordingly, light which passes through the light control layer AR and is incident onto the display panel DP and the sensor layer TU may be non-polarized light. The display panel DP and the sensor layer TU may receive non-polarized light from above the light control layer AR.

The sensor layer TU may be provided between the display panel DP and the light control layer AR. The sensor layer TU may acquire information with which an image is to be displayed on the display panel DP by an external input. The external input may be a user's input. The user's input may include one or more suitable forms of external inputs such as a part of a user's body, light, heat, a pen, and/or pressure.

Figure 3:
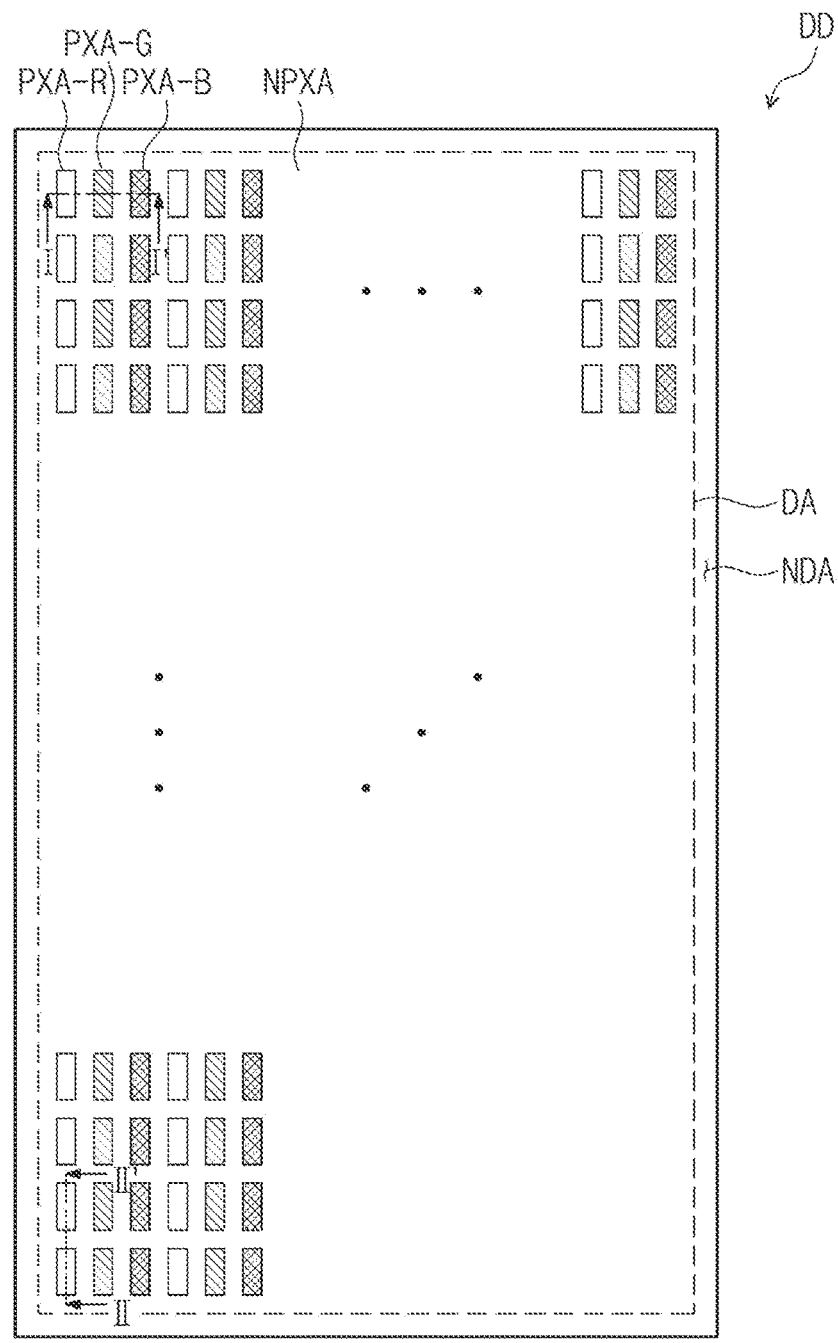
FIG. 3 is a plan view of a display device according to one or more embodiments.
Figure 3:
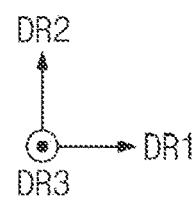
Figure 4A:
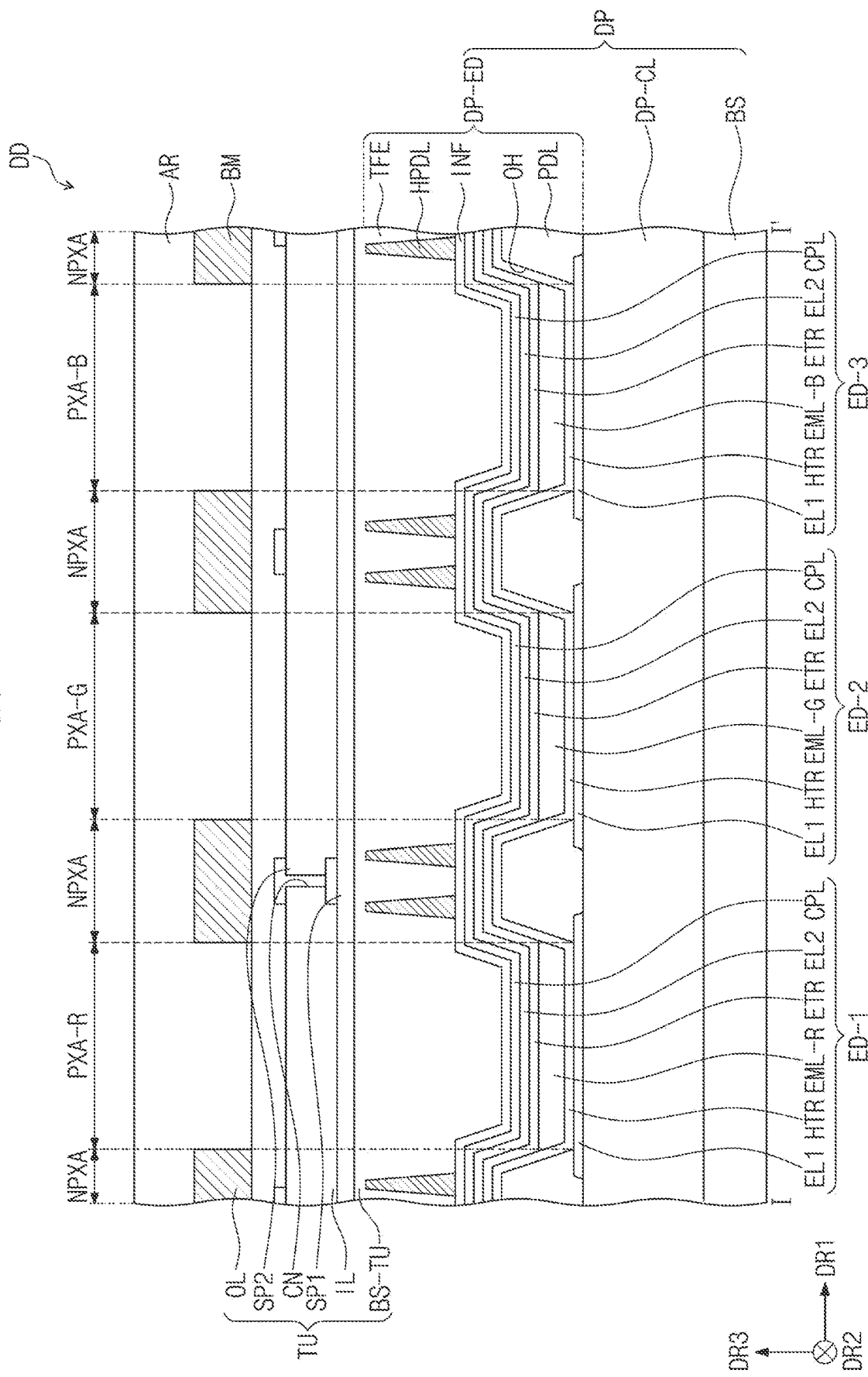
FIGS. 4A and 4B are each a cross-sectional view of a display device according to one or more embodiments.
Figure 4B:
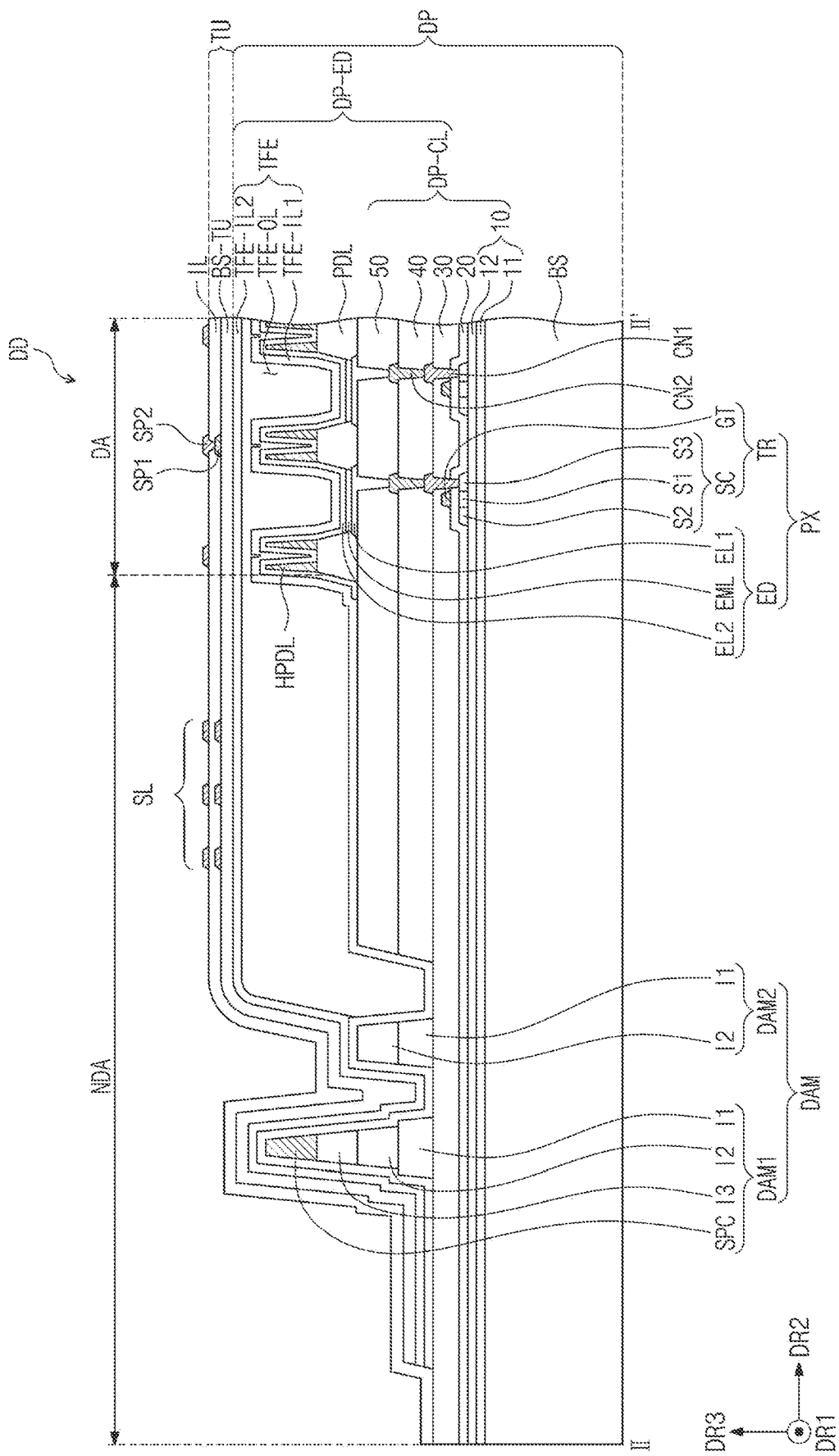

FIG. 3 is a plan view of a display device according to one or more embodiments. FIGS. 4A and 4B are each a cross-sectional view of a display device according to one or more embodiments. FIG. 4A is a cross-sectional view of a part, of a display device according to one or more embodiments, taken along line I-I' in FIG. 3. FIG. 4B is a cross-sectional view of a part, of a display device according to one or more embodiments, taken along line II-II' in FIG. 3. In some embodiments, FIG. 4B illustrates a configuration of a circuit layer DP-CL in more detail, and some components such as a hole transport region HTR, an electron transport region ETR, a capping layer CPL, an inorganic deposition layer INF, an organic insulating layer OL, a light-blocking portion BM, and a light control layer AR among components illustrated in FIG. 4A are not illustrated in FIG. 4B.

Referring to FIGS. 3, 4A, and 4B, a display device DD according to one or more embodiments includes, sequentially stacked, a display panel DP, a sensor layer TU provided on the display panel DP, and a light control layer AR provided on the sensor layer TU.

The display panel DP may include a base layer BS, a circuit layer DP-CL, and a display element layer DP-ED, which are sequentially stacked. The display element layer DP-ED includes a pixel-defining film PDL, light-emitting elements ED, ED-1, ED-2, and ED-3 (see FIGS. 4A and 4B) provided in an opening defined in the pixel-defining film PDL, and an encapsulation layer TFE provided on the light-emitting elements ED, ED-1, ED-2, and ED-3.

The base layer BS has an insulating property. The base layer BS may have a ductility to be bendable. For example, the base layer BS may be an insulating polymer film.

Referring to FIG. 4B, the circuit layer DP-CL may be provided on the base layer BS, and may include a plurality of insulating layers 10, 20, 30, 40, and 50, and at least one transistor TR.

A first insulating layer 10 may be provided on the base layer BS. The first insulating layer 10 may include a barrier layer 11 and a buffer layer 12. The barrier layer 11 prevents or reduces introduction or penetration of foreign matters from the outside. The barrier layer 11 may include at least any one of a silicon oxide layer or a silicon nitride layer. Each of the silicon oxide layer and the silicon nitride layer may be provided in plurality, and silicon oxide layers and silicon nitride layers may be alternately stacked.

The buffer layer 12 may be provided on the barrier layer 11. The buffer layer 12 enhances a bonding force between the base layer BS and a semiconductor pattern and/or a conductive pattern. The buffer layer 12 may include at least any one of a silicon oxide layer or a silicon nitride layer. The silicon oxide layer and the silicon nitride layer may be alternately stacked.

Pixels PX are provided on the first insulating layer 10. FIGS. 4A and 4B illustrate a partial configuration of a pixel PX as an example. The pixel PX may include a transistor TR and a light-emitting element ED.

The transistor TR may include a semiconductor pattern SC and a gate GT. The semiconductor pattern SC may be provided on the first insulating layer 10. The semiconductor pattern SC may include a channel S1, a source S2, and a drain S3. The semiconductor pattern SC may include a silicon semiconductor, a single-crystal silicon semiconductor, a poly silicon semiconductor, and/or an amorphous silicon semiconductor. In some embodiments, the semiconductor pattern SC may include an oxide semiconductor. When the semiconductor pattern SC according to one or more embodiments of the present disclosure has a semiconductor property, the semiconductor pattern SC may be formed of one or more suitable materials, and is not limited to any one embodiment.

The semiconductor pattern SC has an electrical property different depending on whether it is doped or not. The semiconductor pattern may include a doped and an undoped region. The doped region may be doped with an N-type dopant (e.g., an N-dopant) or a P-type dopant (e.g., a P-dopant). A P-type transistor includes a doped region doped with a P-type dopant. The doped region has a greater conductivity than the undoped region, and substantially serves as an electrode or a signal line. The undoped region substantially corresponds to a channel (or active) of a transistor. For example, a part of the semiconductor pattern SC may be the channel S1 of the transistor TR, another part may be the source S2 or the drain S3 of the transistor TR, and a still another part may be a connection signal line (or connection electrode).

A second insulating layer 20 is provided on the first insulating layer 10 to cover the semiconductor pattern SC. The second insulating layer 20 may be provided between the semiconductor pattern SC and the gate GT of the transistor TR. The second insulating layer 20 may be an inorganic layer and/or an organic layer, and may have a single- or multi-layered structure. The second insulating layer 20 may include at least one of aluminum oxide, titanium oxide, silicon oxide, silicon oxynitride, zirconium oxide, or hafnium oxide. In the present embodiments, the second insulating layer 20 may be a single-layered silicon oxide layer. An inorganic layer to be described in more detail herein below may include at least one of the aforementioned materials.

The gate GT may be provided on the second insulating layer 20. The gate GT may be a part of a metal pattern. The gate GT may overlap the channel S1 on a plane (e.g., in a plan view or in a thickness direction of the display device). In a process of doping the semiconductor pattern SC, the gate GT may function as a mask.

A third insulating layer 30 may be provided on the second insulating layer 20 to cover the gate GT. The third insulating layer 30 may be an inorganic layer, and may have a single- or multi-layered structure. In the present embodiment, the third insulating layer 30 may be a single-layered silicon oxide layer.

In some embodiments, in the transistor TR, the source S2 and/or the drain S3 may be electrodes which are independently formed from the semiconductor pattern SC. In this case, the source S2 and/or the drain S3 may be in contact with the semiconductor pattern SC, or may penetrate an insulating layer to be connected to the semiconductor pattern SC. In some embodiments, the gate GT may be provided under the semiconductor pattern SC (e.g., to form a bottom-gate-structured transistor TR). The transistor TR according to one or more embodiments of the present disclosure may be formed in one or more suitable structures, and is not limited to any one embodiment.

A fourth insulating layer 40 may be provided on the third insulating layer 30. The fourth insulating layer 40 may be an organic layer, and may have a single- or multi-layered structure. For example, the fourth insulating layer 40 may be a single-layered polyimide-based resin layer. However, embodiments of the present disclosure are not limited thereto, and the fourth insulating layer 40 may include at least any one of an acryl-based resin, a methacryl-based resin, a polyisoprene-based resin, a vinyl-based resin, an epoxy-based resin, a urethane-based resin, a cellulose-based resin, a siloxane-based resin, a polyamide-based resin, or a perylene-based resin. An organic layer to be described in more detail herein below may include at least one of the aforementioned materials.

A first connection electrode CN1 may be provided on the third insulating layer 30, and a second connection electrode CN2 may be provided on the fourth insulating layer 40. The first connection electrode CN1 may penetrate the second insulating layer 20 and the third insulating layer 30 to be electrically connected to the semiconductor pattern SC. The second connection electrode CN2 may penetrate the fourth insulating layer 40 to be electrically connected to the first connection electrode CN1.

In some embodiments, at least any one of the first connection electrode CN1 or the second connection electrode CN2 may not be provided. In some embodiments, an additional connection electrode which connects the light-emitting element ED and the transistor TR may be further provided. Depending on the number of insulating layers provided between the light-emitting element ED and the transistor TR, a method for electrical connection between the light-emitting element ED and the transistor TR may be variously suitably changed, and is not limited to any one embodiment.

A fifth insulating layer 50 may be provided on the fourth insulating layer 40 to cover the second connection electrode CN2. The fifth insulating layer 50 may be an organic layer and/or an inorganic layer, and may have a single- or multi-layered structure.

Referring to FIGS. 4A and 4B together, light-emitting elements ED, ED-1, ED-2, and ED-3 may each include a first electrode EIJI, a hole transport region HTR, a corresponding one of the light-emitting layers EML, EML-R, EML-G, and EML-B, an electron transport region ETR, a second electrode EL2, and a capping layer CPL. The first electrode EL1 may be electrically connected to a transistor TR through a first connection electrode CN1 and a second connection electrode CN2.

FIG. 4A illustrates one or more embodiments in which the light-emitting layers EML-R, EML-G, and EML-B of light-emitting elements ED-1, ED-2, and ED-3 are provided in openings OH defined in pixel-defining films PDL, and the hole transport region HTR, the electron transport region ETR, the second electrode EL2, and the capping layer CPL are provided as a common layer in the entirety (e.g., in all three) of the light-emitting elements ED-1, ED-2, and ED-3. However, embodiments of the present disclosure are not limited thereto, and in one or more embodiments, the hole transport region HTR, the electron transport region ETR, the second electrode EL2, the capping layer CPL, etc., may be provided by being patterned inside the openings OH defined in the pixel-defining films PDL. In one or more embodiments, at least any one of the hole transport region HTR, the light-emitting layers EML-R, EML-G, and EML-B, the electron transport region ETR, or the capping layer CPL of the light-emitting elements ED-1, ED-2, and ED-3 may be provided by being patterned through inkjet printing.

Referring to FIGS. 4A and 4B together, the encapsulation layer TFE is provided on the pixel-defining films PDL to cover the light-emitting elements ED, ED-1, ED-2, and ED-3. The encapsulation layer TFE may be provided on the second electrode EL2 to fill a part of the opening OH.

The encapsulation layer TFE may be a thin film encapsulation layer. The encapsulation layer TFE may be a single layer or a stack of a plurality of layers. The encapsulation layer TFE includes at least one organic film. The encapsulation layer TFE may include a first inorganic encapsulation layer TFE-IL1, an organic encapsulation layer TFE-OL, and a second inorganic encapsulation layer TFE-IL2.

The first inorganic encapsulation layer TFE-IL1 may be provided on the second electrode EL2. The organic encapsulation layer TFE-OL may be provided on the first inorganic encapsulation layer TFE-IL1. The second inorganic encapsulation layer TFE-IL2 may be provided on the organic encapsulation layer TFE-OL to cover the organic encapsulation layer TFE-OL. The first inorganic encapsulation layer TFE-IL1 and the second inorganic encapsulation layer TFE-IL2 may each independently include a silicon nitride layer, a silicon oxynitride layer, a silicon oxide layer, a titanium oxide layer, or an aluminum oxide layer, but one or more embodiments of the present disclosure are not limited thereto. The organic encapsulation layer TFE-OL may include an acryl-based organic layer, but one or more embodiments of the present disclosure are not specifically limited. The encapsulation layer TFE (e.g., the first inorganic encapsulation layer TFE-IL1 and the second inorganic encapsulation layer TFE-IL2) may protect the light-emitting element ED from moisture/oxygen and/or foreign matters. For example, the first inorganic encapsulation layer TFE-IL1 and the second inorganic encapsulation layer TFE-IL2 protect the display element layer DP-ED from moisture/oxygen, and the organic encapsulation layer TFE-OL protects the display element layer DP-ED from foreign matters such as dust particles.

The display device DD may include a non-light-emitting region NPXA and light-emitting regions PXA-R, PXA-G, and PXA-B. The light-emitting regions PXA-R, PXA-G, and PXA-B may be each a region that emits light generated in a corresponding one of the light-emitting elements ED-1, ED-2, and ED-3. The light-emitting regions PXA-R, PXA-G, and PXA-B may be spaced apart from each other on a plane (e.g., in a plan view).

The light-emitting regions PXA-R, PXA-G, and PXA-B may be separated from each other by the pixel-defining films PDL. The non-light-emitting regions NPXA may be regions between adjacent light-emitting regions PXA-R, PXA-G, and PXA-B, and corresponding to the pixel-defining films PDL. In some embodiments, in the present disclosure, the light-emitting regions PXA-R, PXA-G, and PXA-B may respectively correspond to pixels. The pixel-defining films PDL may separate the light-emitting elements ED-1, ED-2, and ED-3. The light-emitting layers EML-R, EML-G, and EML-B of the light-emitting elements ED-1, ED-2, and ED-3 may be provided in the openings OH defined in the pixel-defining films PDL and separated from each other.

The light-emitting regions PXA-R, PXA-G, and PXA-B may be divided into a plurality of groups depending on the color of light generated in the light-emitting elements ED-1, ED-2, and ED-3. In the display device DD according to one or more embodiments illustrated in FIGS. 1 and 2, three light-emitting regions PXA-R, PXA-G, and PXA-B, which emit red light, green light, and blue light, are illustrated as an example. For example, the display device DD according to one or more embodiments may include a red light-emitting region PXA-R, a green light-emitting region PXA-G, and a blue light-emitting region PXA-B which are separated from each other.

In the display device DD according to one or more embodiments, a plurality of the light-emitting elements ED-1, ED-2, and ED-3 may be to emit light having different wavelength ranges. For example, in one or more embodiments, the display device DD may include a first light-emitting element ED-1 that emits red light, a second light-emitting element ED-2 that emits green light, and a third light-emitting element ED-3 that emits blue light. For example, the red light-emitting region PXA-R, the green light-emitting region PXA-G, and the blue light-emitting region PXA-B of the display device DD may respectively correspond to the first light-emitting element ED-1, the second light-emitting element ED-2, and the third light-emitting element ED-3.

However, embodiments of the present disclosure are not limited thereto, the first to third light-emitting elements ED-1, ED-2, and ED-3 may all emit light having the same wavelength range, or at least one thereof may be to emit light having another (e.g., different) wavelength range. For example, the first to third light-emitting elements ED-1, ED-2, and ED-3 may all emit blue light.

The light-emitting regions PXA-R, PXA-G, and PXA-B of the display device DD according to one or more embodiments may be arranged in the form of a stripe. Referring to FIG. 3, a plurality of red light-emitting regions PXA-R may be aligned with each other along the second direction DR2, a plurality of green light-emitting regions PXA-G may be aligned with each other along the second direction DR2, and a plurality of blue light-emitting regions PXA-B may be aligned with each other along the second direction DR2. In some embodiments, the red light-emitting regions PXA-R, the green light-emitting regions PXA-G, and the blue light-emitting regions PXA-B may be sequentially and alternately arranged with each other along the first direction DR1.

FIGS. 3 and 4A illustrate that the areas of the light-emitting regions PXA-R, PXA-G, and PXA-B are all similar, but embodiments of the present disclosure are not limited thereto, and the areas of the light-emitting regions PXA-R, PXA-G, and PXA-B may be different from each other depending on a wavelength range of emitted light. In some embodiments, the areas of the light-emitting regions PXA-R, PXA-G, and PXA-B may refer to areas as seen on a plane defined by the first direction DR1 and the second direction DR2.

In some embodiments, the arrangement form of the light-emitting regions PXA-R, PXA-G, and PXA-B is not limited to what is illustrated in FIG. 3, and the arrangement sequence of the red light-emitting region PXA-R, the green light-emitting region PXA-G, and the blue light-emitting region PXA-B may be provided in one or more suitable combinations depending on the characteristics of display quality required for the display device DD. For example, the arrangement form of the light-emitting regions PXA-R, PXA-G, and PXA-B may be a pentile (PENTILE®) arrangement form (PENTILE® is a registered trademark owned by Samsung Display Co., Ltd.) or a diamond arrangement form.

In some embodiments, the areas of the light-emitting regions PXA-R, PXA-G, and PXA-B may be different from each other. For example, in one or more embodiments, the area of the green light-emitting region PXA-G may be smaller than the area of the blue light-emitting region PXA-B, but one or more embodiments of the present disclosure are not limited thereto.

Referring to FIG. 4A again, the display panel DP according to one or more embodiments includes the inorganic deposition layer INF provided on the light-emitting elements ED-1, ED-2, and ED-3.

The inorganic deposition layer INF is provided on the capping layer CPL. The inorganic deposition layer INF may be directly provided on the capping layer CPL. The inorganic deposition layer INF may be a layer for preventing or reducing reflection of external light from by the second electrode EL2 of the light-emitting elements ED-1, ED-2, and ED-3. For example, destructive interference may occur between light reflected on the surface of the inorganic deposition layer INF and light reflected on the second electrode EL2, thereby reducing the amount of external light reflected on the surface of the second electrode EL2. The thicknesses of the inorganic deposition layer INF and the capping layer CPL may be controlled or selected so that destructive interference may occur between light reflected on the surface of the inorganic deposition layer INF and light reflected on the second electrode EL2.

The inorganic deposition layer INF may include an inorganic material having a refractive index of about 1.0 or more, and a light absorption coefficient of about 0.5 or more. The inorganic deposition layer INF may be formed through a thermal deposition process, and may include an inorganic material having a melting point of about 1000° C. or less. For example, the inorganic deposition layer INF may include at least one selected from the group consisting of bismuth (Bi) and ytterbium (Yb). The material which forms the inorganic deposition layer INF may be composed of bismuth (Bi), or ytterbium (Yb), or may be a mixed deposition material of $Yb_xBi_y$. The encapsulation layer TFE may be directly provided on at least a part of the inorganic deposition layer INF.

The display panel DP according to one or more embodiments includes a low refractive pattern layer HPDL provided on the pixel-defining film PDL. The low refractive pattern layer HPDL may be provided so as to overlap the non-light-emitting region NPXA.

The low refractive pattern layer HPDL may be a layer having a smaller refractive index than an adjacent encapsulation layer TFE, and may collect light which is generated by the light-emitting element ED through total reflection to improve the light-emitting efficiency of the display panel DP. For example, because the low refractive pattern layer HPDL has a smaller refractive index (e.g., smaller in refractive index) than an adjacent encapsulation layer TFE, laterally propagating light of the light which is generated by the light-emitting element ED may be totally reflected on a side surface of the low refractive pattern layer HPDL, thereby changing the path of the light so that that the laterally propagating light propagates forward. Accordingly, the forward light emission efficiency of each of light-emitting elements ED, ED-1, ED-2, and ED-3 may be improved, and the light-emitting efficiency of the display panel DP including the light-emitting elements ED, ED-1, ED-2, and ED-3 may be improved. More detailed description of the low refractive pattern layer HPDL will be provided herein below in the description of FIGS. 5A to 5D.

In one or more embodiments, the light control layer AR may be provided on the display panel DP. The light control layer AR may entirely overlap the display element layer DP-ED. The light control layer AR may entirely overlap each of a first light-emitting element ED-1, a second light-emitting element ED-2, and a third light-emitting element ED-3. The light control layer AR may be provided as a single substantially continuous layer. The light control layer AR may protect the display panel DP by covering the front surface of the display panel DP. Light, which passes through the light control layer AR and is emitted from the display panel DP, may be partially absorbed and partially transmitted, thereby improving color reproducibility. The color reproducibility refers to a range of color which may be shown by a display device. For example, the color reproducibility may be improved by selective absorption of light having a set or specific wavelength range.

The light control layer AR provided on the display panel DP may not include (e.g., may exclude) a polarization layer, and may be a layer in which a dye and/or a pigment are/is dispersed in a base resin. Because the light control layer AR does not include a polarization layer, light, which passes through the light control layer AR and is incident on the display panel DP and the sensor layer TU, may be non-polarized light. The display panel DP and the sensor layer TU may receive non-polarized light from above the light control layer AR.

The dye and/or the pigment included in the light control layer AR may be a material which transmits only light having a set or specific wavelength range, of light emitted by the light-emitting elements ED-1, ED-2, and ED-3. In one or more embodiments, the dye and/or the pigment may be a material which absorbs light having a wavelength range of about 490 nm to about 505 nm and light having a wavelength range of about 585 nm to about 600 nm, and transmits light having the other wavelength ranges. The dye and/or the pigment may have a maximum absorption wavelength in a wavelength range of about 490 nm to about 505 nm, and in a wavelength range of about 585 nm to about 600 nm. Because the dye and/or the pigment included in the light control layer AR absorb light having a set or specific wavelength range and transmit light having the other wavelength ranges, the light control layer AR may prevent or reduce reflection of external light and may adjust the color of light emitted from the display panel DP.

The dye and/or the pigment included in the light control layer AR may include at least one selected from the group consisting of an anthraquinone-based compound, a phthalocyanine-based compound, an azo-based compound, a perylene-based compound, a xanthene-based compound, a diimonium-based compound, a dipyrromethene-based compound, a tetraazaporphyrin-based compound, a porphyrin-based compound, a squarylium-based compound, an oxazine-based compound, a triarylmethane-based compound, a cyanine-based compound, and combinations thereof. For example, the light control layer AR may include any one of a tetraazaporphyrin-based compound, a cyanine-based compound, a squarylium-based compound, an oxazine-based compound, or a combination thereof. The light control layer AR may include the dye and/or the pigment in an amount of about 0.01 wt % to about 5.00 wt % with respect to the total weight of the light control layer AR. When the light control layer AR includes the dye and/or the pigment in an amount of less than about 0.01 wt %, the light control layer AR may not sufficiently or suitably absorb light having a set or specific wavelength range, and thus not improve color reproducibility. When the light control layer AR includes the dye and/or the pigment in an amount of more than about 5.00 wt %, aggregation of the dye and the pigment may occur.

In one or more embodiments, the display device DD may further light-blocking portions BM provided on the display element layer DP-ED, covered by the light control layer AR, and overlapping the non-light-emitting region NPXA. The light-blocking portions BM may be provided apart from each other. The light-blocking portions BM may prevent or reduce a light leakage phenomenon. The light-blocking portions BM may be light-blocking members. The light-blocking portions BM may include an organic light-blocking material, a black pigment, a black dye, and/or the like. The light control layer AR may fill a space between the light-blocking portions BM spaced apart from each other.

In one or more embodiments, the sensor layer TU is provided between the display panel DP and the light control layer AR. The sensor layer TU may include a sensor base layer BS-TU, a first conductive layer SP1, an inorganic insulating layer IL, a second conductive layer SP2, and an organic insulating layer OL. The first conductive layer SP1 may be provided on the sensor base layer BS-TU. The inorganic insulating layer IL may be provided on the base layer BS-TU and the first conductive layer SP1, while covering the first conductive layer SP1. The second conductive layer SP2 may be provided on the inorganic insulating layer IL. The organic insulating layer OL may be provided on the inorganic insulating layer IL and the second conductive layer SP2, while covering (e.g., and may cover) the second conductive layer SP2.

The sensor base layer BS-TU may be an inorganic layer which includes any one selected from among silicon nitride, silicon oxynitride, and silicon oxide. In some embodiments, the sensor base layer BS-TU may be an organic layer which includes an epoxy resin, an acryl resin, and/or an imide-based resin. The sensor base layer BS-TU may have a single-layered structure, or a multi-layered structure in which layers are stacked along the third direction DR3. The sensor base layer BS-TU may be directly provided on the encapsulation layer TFE. The sensor base layer BS-TU may be directly provided on the second inorganic encapsulation layer TFE-IL2.

The first conductive layer SP1 and the second conductive layer SP2 may each have a single-layered structure, or a multi-layered structure in which layers are stacked along the third direction DR3. Conductive layers SP1 and SP2, each having a single-layered structure, may each independently include a metal layer or a transparent conductive layer. The metal layer may include molybdenum, silver, titanium, copper, aluminum, or an alloy thereof. The transparent conductive layer may include a transparent conductive oxide such as indium-tin oxide (ITO), indium-zinc oxide (IZO), zinc oxide (ZnO), and/or indium-zinc-tin oxide (IZTO). In some embodiments, the transparent conductive layer may include a conductive polymer such as PEDOT, a metal nano-wire, graphene, and/or the like.

The conductive layers SP1 and SP2, each having a multi-layered structure, may each independently include metal layers. The metal layers may have, for example, a three-layered structure of titanium (Ti)/aluminum (AD/titanium (Ti). The multi-layered conductive layers SP1 and SP2 may include at least one metal layer and at least one transparent conductive layer.

The inorganic insulating layer IL may include at least one of aluminum oxide, titanium oxide, silicon oxide, silicon oxynitride, zirconium oxide, or hafnium oxide.

A contact hole CN may be defined in the inorganic insulating layer IL. The first conductive layer SP1 and the second conductive layer SP2 may be electrically connected through the contact hole CN. The contact hole CN may be filled with the material of the second conductive layer SP2. FIG. 4A illustrates that one contact hole CN is defined in the inorganic insulating layer IL, but one or more embodiments of the present disclosure are not limited thereto, and a plurality of contact holes may be defined in the inorganic insulating layer.

The organic insulating layer OL may cover the inorganic insulating layer IL and the second conductive layer SP2, and may include at least one of an acryl-based resin, a methacryl-based resin, a polyisoprene-based resin, a vinyl-based resin, an epoxy-based resin, a urethane-based resin, a cellulose-based resin, a siloxane-based resin, a polyimide-based resin, a polyimide-based resin, or a perylene-based resin.

Referring to FIG. 4B, the display panel DP may further include a dam DAM provided in the non-display region NDA. The dam DAM may be provided in the peripheral region of a display module DM to prevent or reduce the overflow of the organic encapsulation layer TFE-OL.

The dam DAM may be provided in plurality. The dam DAM may include a first dam DAM1, and a second dam DAM2. The first dam DAM1 and the second dam DAM2 are sequentially arranged along a direction towards the display region DA (e.g., along the second direction DR2). For example, the first dam DAM1 may be provided further apart from the display region DA than the second dam DAM2 is from the display region DA, and the second dam DAM2 may be provided between the display region DA and a region in which the first dam DAM1 is provided.

The dams DAM1 and DAM2 may each include a plurality of layers. In one or more embodiments, the first dam DAM1 may include a first layer l1, a second layer l2, and a third layer l3, and the second dam DAM2 may include the first layer l1 and the second layer l2. The first dam DAM1 may be higher than the second dam DAM2. The first layer l1 and the fourth insulating layer 40 may include the same material, and may be formed through the same process. The second layer l2 and the fifth insulating layer 50 may include the same material, and may be formed through the same process. The third layer l3 and the pixel-defining film PDL may include the same material, and may be formed through the same process.

In the first dam DAM1 provided in the peripheral region, a spacer SPC may be provided on the third layer l3. The spacer SPC may be provided on the uppermost portion of the first dam DAM1 to increase the height of the first dam DAM1, thereby further preventing or reducing the overflow of the organic encapsulation layer TFE-OL. In some embodiments, when a metal mask is provided on the display panel DP in a later process of manufacturing the sensor layer TU and/or the like, the spacer SPC may ensure a space between the metal mask and lower components, thereby preventing or reducing dents to the underlying components by the metal mask.

In one or more embodiments, the spacer SPC and the low refractive pattern layer HPDL may be provided on the same layer. The spacer SPC and the low refractive pattern layer HPDL may include the same material, and may be formed through the same process. Because the spacer SPC and the low refractive pattern layer HPDL are formed through the same process, a separate mask process for forming the low refractive pattern layer HPDL on the pixel-defining film PDL may not be added, and the spacer SPC and the low refractive pattern layer HPDL may be concurrently (e.g., simultaneously) formed in the process of forming the spacer SPC in the first dam DAM1.

Parts of the first conductive layer SP1 and the second conductive layer SP2 may be signal lines SL. For example, in the present embodiment, it is illustrated that the signal lines SL include a plurality of layers provided on a first sensing insulating layer ISU-IL1 and a second sensing insulating layer ISU-IL2. The signal lines SL may have a double layered structure including a first signal line provided on the first sensing insulating layer ISU-IL1 (e.g., the sensor base layer BS-TU) and a second signal line provided on the second sensing insulating layer ISU-IL2 (e.g., the inorganic insulating layer IL). However, this is illustrated as an example, and at least a part of the signal lines SL may correspond to only one of the first conductive layer SP1 or the second conductive layer SP2, and is not limited to any one embodiment.

FIGS. 5A to 5D are each an enlarged cross-sectional view of a part of a display panel according to one or more embodiments of the present disclosure. FIGS. 5A to 5D illustrate, in more detail, a shape in which a low refractive pattern layer HPDL is provided on a pixel-defining film PDL, in a configuration illustrated in FIG. 4A. Hereinafter, more detailed description of the low refractive pattern layer HPDL according to the present disclosure will be made with reference to FIGS. 5A to 5D, and the same reference numerals or symbols are given to the same components as those described above, and redundant descriptions thereof will not be provided.

Figure 5A:
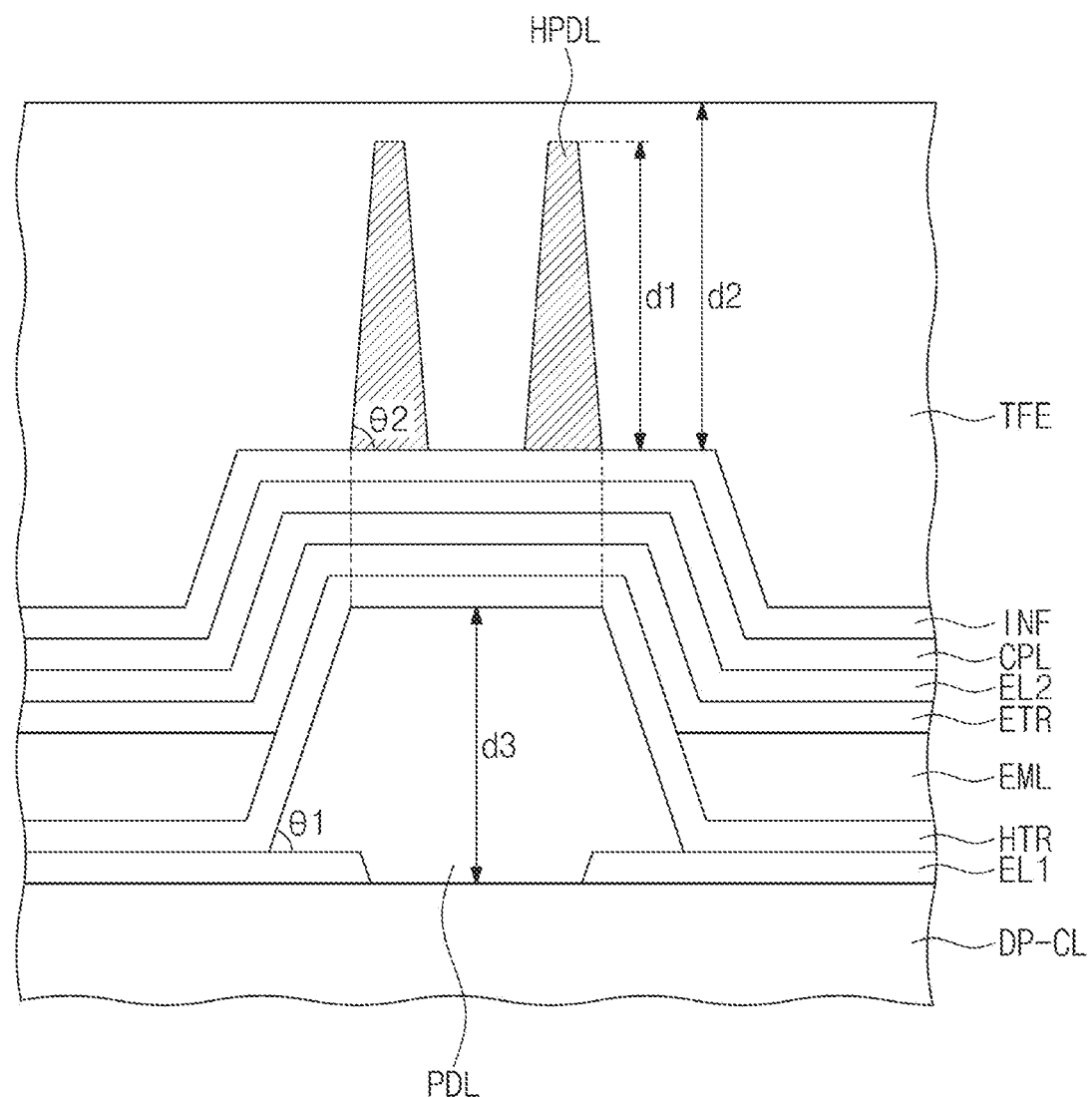
FIGS. 5A-5D are each an enlarged cross-sectional view of a part of a display panel according to one or more embodiments of the present disclosure.

Referring to FIG. 5A, the low refractive pattern layer HPDL may be provided on the pixel-defining film PDL, and the lower end of the low refractive pattern layer HPDL and the upper end of the pixel-defining film PDL may be identical to each other (e.g., may be aligned with each other along the third direction DR3). The low refractive pattern layer HPDL may include two sub patterns on a cross-section, and the lower end of each sub pattern may be aligned with the respective upper end of the pixel-defining film PDL.

Referring to FIGS. 4A, 4B, and 5A together, in one or more embodiments, a hole transport region HTR, an electron transport region ETR, a second electrode EL2, and a capping layer CPL included in a light-emitting element ED may be provided as common layers in the entirety of a non-light-emitting region NPXA and light-emitting regions PXA-R, PXA-G, and PXA-B, and an inorganic deposition layer INF may be also provided as a common layer. Accordingly, a part of each of the hole transport region HTR, the electron transport region ETR, the second electrode EL2, the capping layer CPL, and the inorganic deposition layer INF may be provided on the pixel-defining film PDL. The low refractive pattern layer HPDL may be provided on the inorganic deposition layer INF provided on the pixel-defining film PDL. The low refractive pattern layer HPDL may be directly provided on an upper surface of the inorganic deposition layer INF.

A first angle $\theta 1$ formed between a side surface of the pixel-defining film PDL and an upper surface of a base layer BS may be smaller than a second angle $\theta 2$ formed between a side surface of the low refractive pattern layer HPDL and the upper surface of the base layer BS. In FIG. 5A, it is illustrated that the first angle $\theta 1$ is formed with respect to an upper surface of the first electrode EL1 parallel (or substantially parallel) to the upper surface of the base layer BS, and the second angle $\theta 2$ is formed with respect to an upper surface of the inorganic deposition layer INF parallel (or substantially parallel) to the upper surface of the base layer BS.

In one or more embodiments, the first angle $\theta 1$ may be about 60° to about 85°. When the first angle $\theta 1$ is less than about 60°, the low refractive pattern layer HPDL may be provided too far from a light-emitting layer EML, thereby reducing the effect of total reflection at an interface caused by the low refractive pattern layer HPDL. When the first angle θ1 is more than about 85°, a manufacturing process may be unsatisfactorily performed, and it may be difficult to distinguish a non-light-emitting region and light-emitting regions.

In one or more embodiments, the second angle θ2 may be about 70° to about 88°. When the second angle θ2 is less than about 70°, the effect of total reflection at an interface caused by the low refractive pattern layer HPDL may be reduced, and it may be difficult to change the path of light in the front direction. When the second angle θ2 is more than about 88°, a manufacturing process may be unsatisfactorily performed.

A first thickness d1 of the low refractive pattern layer HPDL may be about 3 μm to about 4 μm. The first thickness d1 of the low refractive pattern layer HPDL may be smaller than a second thickness d2, measured from an upper surface of the inorganic deposition layer INF, which is a base plane on which the low refractive pattern layer HPDL is provided, to an upper surface of the encapsulation layer TFE. The difference between the first thickness d1 and the second thickness d2 may be about 2 μm or less. In one or more embodiments, the second thickness d2 may be about 4 μm to about 6.5 μm, and the first thickness d1 may be about 3 μm to about 4.5 μm. In the display panel DP according to one or more embodiments, the difference between the first thickness d1 and the second thickness d2 is controlled or selected to be about 1 μm or less, so that light extraction effect may be maximized or increased. A third thickness d3 of the pixel-defining film PDL may be about 1.5 μm to about 2 μm.

The low refractive pattern layer HPDL may include a material having a low refractive index. In one or more embodiments, the low refractive pattern layer HPDL may have a refractive index of about 1.45 to about 1.65. By controlling the refractive index of the low refractive pattern layer HPDL to be in the above range, the path of laterally propagating light, of light which is generated by the light-emitting element ED, may be changed to propagate forwards.

The low refractive pattern layer HPDL may have a lower refractive index than the encapsulation layer TFE. In one or more embodiments, the low refractive pattern layer HPDL may have a lower refractive index (e.g., may be lower in refractive index) than the organic encapsulation layer TFE-OL included in the encapsulation layer TFE. The difference between the refractive index of the organic encapsulation layer TFE-OL and the refractive index of the low refractive pattern layer HPDL may be about 0.1 or more. The organic encapsulation layer TFE-OL may have a refractive index of about 1.75 to about 2. In some embodiments, the first inorganic encapsulation layer TFE-IL1 and the second inorganic encapsulation layer TFE-IL2 may each have a refractive index of about 1.6 to about 1.9. The first inorganic encapsulation layer TFE-IL1 and the second inorganic encapsulation layer TFE-IL2 may each have a lower refractive index than the organic encapsulation layer TFE-OL.

A display panel included in a display device according to one or more embodiments includes a low refractive pattern layer provided on a pixel-defining film, and the low refractive pattern layer has a lower refractive index than an encapsulation layer. Because the low refractive pattern layer has a lower refractive index than the encapsulation layer by about 0.1 or more, the path of laterally propagating light, of the light which is generated by a light-emitting element, may be changed to the forward direction, thereby improving light extraction efficiency of the display panel.

Because the low refractive pattern layer has a lower refractive index than the encapsulation layer by about 0.1 or more, light which propagates from the encapsulation layer, having a higher refractive index, toward the low refractive pattern layer, having a lower refractive index, may be totally reflected at the interface therebetween. Accordingly, light, which passes through the encapsulation layer and propagates toward the low refractive pattern layer, of light which is generated by the light-emitting layer, may be totally reflected at the interface between the encapsulation layer and the low refractive pattern layer, so that the path of the light may be changed to the front surface direction of the light-emitting element. Accordingly, illuminance of the light-emitting element in the front surface direction may be improved, and the display panel, and the display device which includes the light-emitting element, may have improved light extraction efficiency.

Figure 5B:
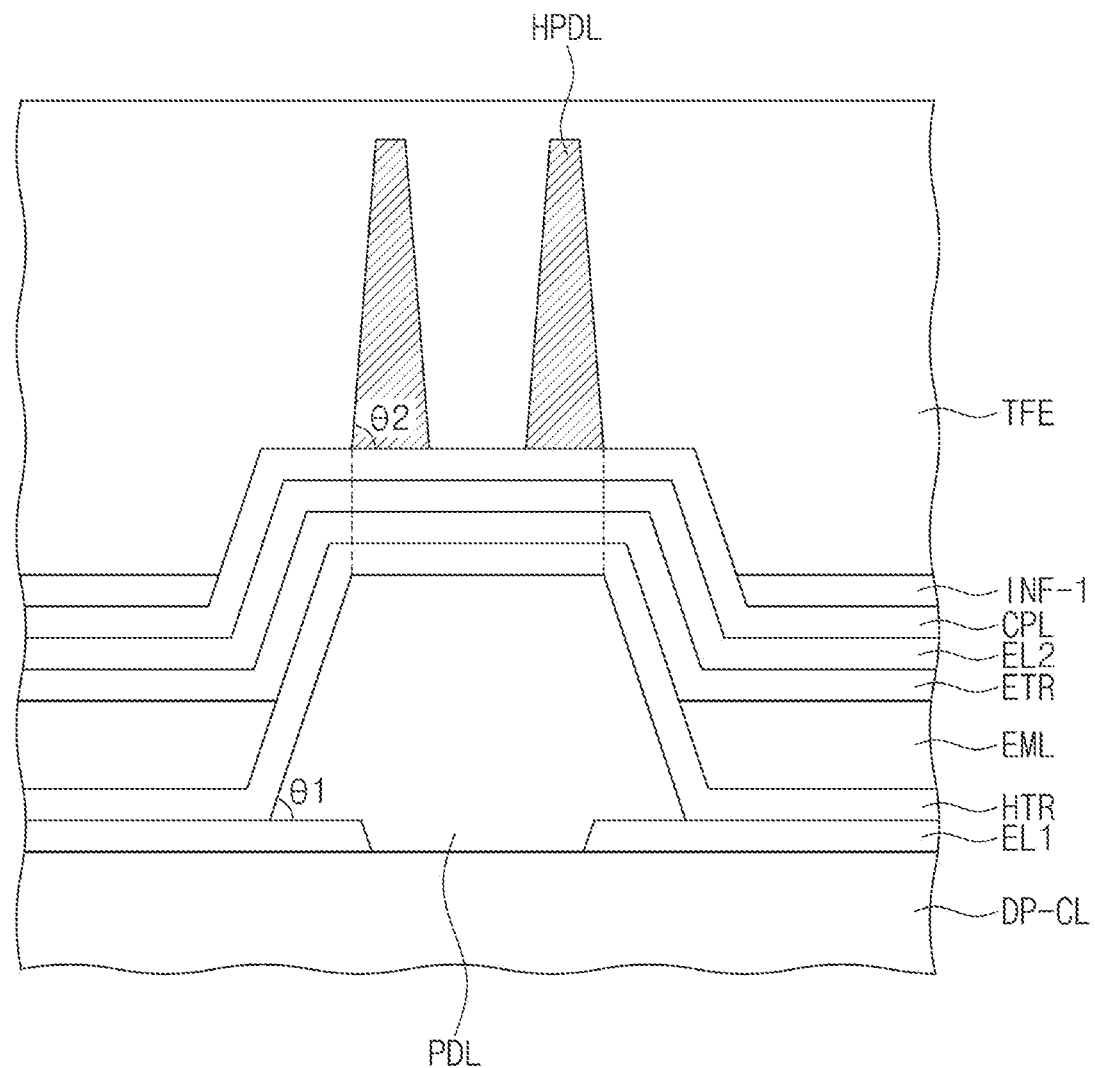
Figure 5C:
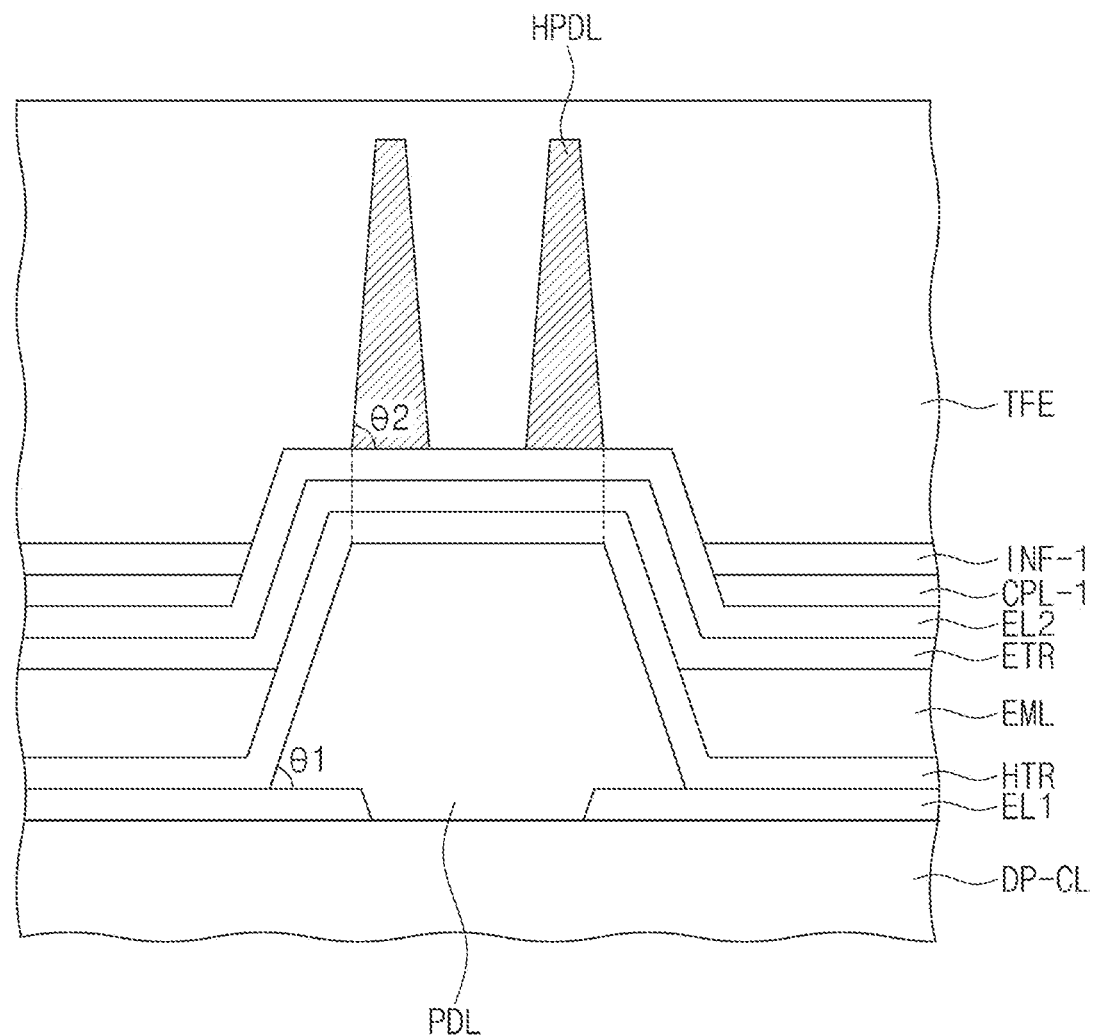
Figure 5D:
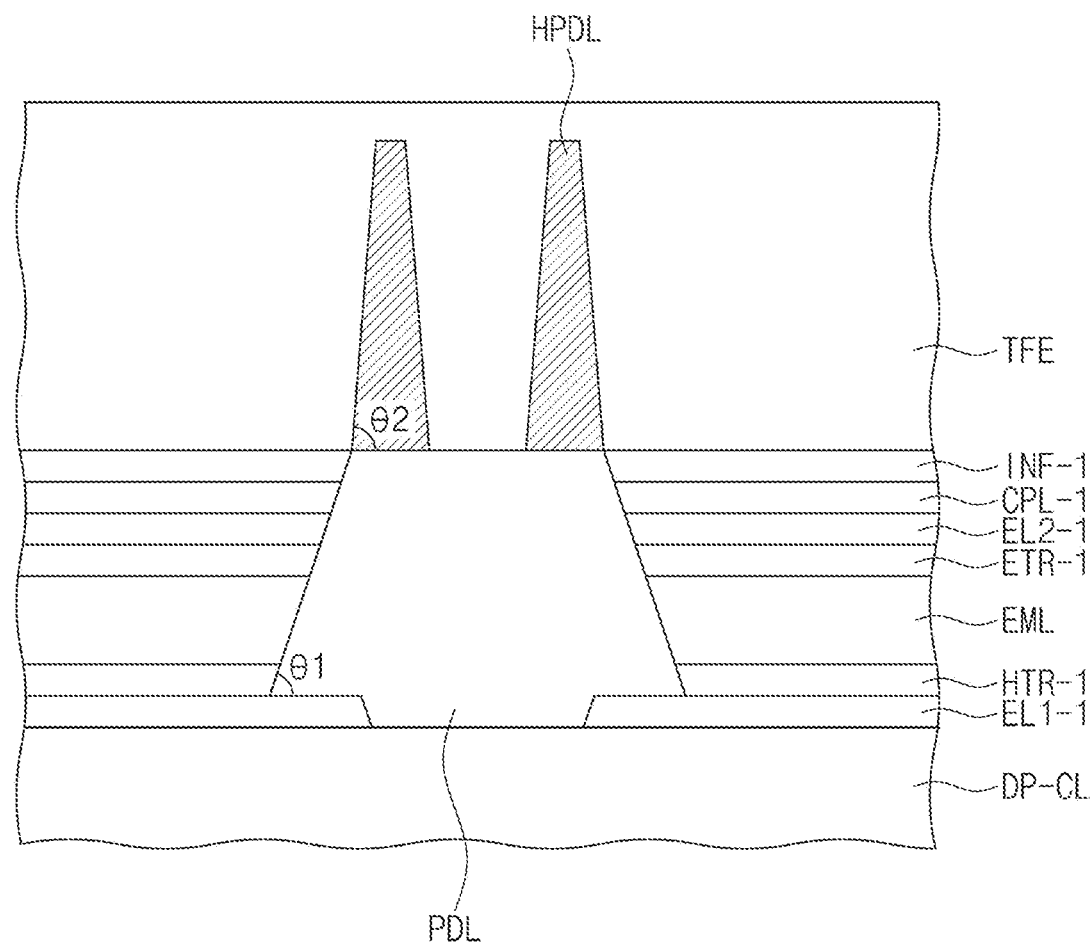

FIGS. 5B to 5D illustrate a disposition relationship of low refractive pattern layers HPDL in display panels according to embodiments different from the embodiment illustrated in FIG. 5A. Hereinafter, description will be made focusing on difference(s) from that of the embodiment illustrated in FIG. 5A.

Referring to FIGS. 5B to 5D, unlike the embodiment illustrated in FIG. 5A, at least one of a hole transport region HTR, an electron transport region ETR, a second electrode EL2, a capping layer CPL, or an inorganic deposition layer INF included in a light-emitting element ED may not be provided as a common layer, and may be provided by being patterned.

In one or more embodiments, as illustrated in FIG. 5B, an inorganic deposition layer INF-1 may be provided by being patterned on a light-emitting element, and may not overlap a pixel-defining film PDL on a plane (e.g., in a plan view). In this case, a part of the inorganic deposition layer INF-1 may not be provided on the pixel-defining film PDL, and a low refractive pattern layer HPDL may be directly provided on a capping layer CPL. The low refractive pattern layer HPDL may be provided to be in contact with an upper surface of the capping layer CPL.

In one or more embodiments, as illustrated in FIG. 5C, an inorganic deposition layer INF-1 may be provided by being patterned on a light-emitting element, and a capping layer CPL-1 may be provided by being patterned in an opening OH (see FIG. 4A). The inorganic deposition layer INF-1 and the capping layer CPL-1 may not overlap the pixel-defining film PDL on a plane (e.g., in a plan view). In this case, parts of the inorganic deposition layer INF-1 and the capping layer CPL-1 may not be provided on the pixel-defining film PDL, and a low refractive pattern layer HPDL may be directly provided on an electron transport region ETR. The low refractive pattern layer HPDL may be provided to be in contact with an upper surface of the electron transport region ETR.

In one or more embodiments, as illustrated in FIG. 5D, an inorganic deposition layer INF-1 may be provided by being patterned on a light-emitting element, and a capping layer CPL-1, a second electrode EL2-1, an electron transport region ETR-1, and a hole transport region HTR-1 may be provided by being patterned in an opening OH (see FIG. 4A) of a pixel-defining film PDL. Parts of the inorganic deposition layer INF-1, the second electrode EL2-1, the electron transport region ETR-1, and the hole transport region HTR-1 may not be provided on the pixel-defining film PDL. A low refractive pattern layer HPDL may be directly provided on the pixel-defining film PDL. The low refractive pattern layer HPDL may be provided to be in contact with an upper surface of the pixel-defining film PDL.

Table 1 below shows values derived by simulating the maximum illuminances for one light-emitting element included in a display panel according to Example, and one light-emitting element included in a display panel according to Comparative Example. In Example, as illustrated in FIGS. 5A to 5D, the maximum illuminance of a display element of a display panel in which an inorganic deposition layer INF is provided on a light-emitting element, and a low refractive pattern layer HPDL is provided on a pixel-defining film PDL was calculated; and in Comparative Example, the maximum illuminance of a display element of a display panel in which the low refractive pattern layer HPDL is omitted was calculated. In Example and Comparative Example, simulation was performed under conditions that a first angle θ1 of the pixel-defining film PDL is about 70°, and an organic encapsulation layer TFE-OL in an encapsulation layer TFE has a refractive index of about 1.9. In Example, simulation was performed under conditions that a second angle θ2 of the low refractive pattern layer HPDL is about 85°, and the low refractive pattern layer HPDL has a refractive index of about 1.55.

TABLE 1

|  | Example | Comparative Example |
| --- | --- | --- |
| Maximum illuminance (Lux) | $2.21 \times 10^8$ | $2.08 \times 10^8$ |

Referring to the results of Table 1, it may be seen that the display panel according to Example includes the low refractive pattern layer compared to the display panel according to Comparative Example in which the low refractive pattern layer is not provided, and it is believed that it thus exhibits the improved maximum illuminance of the light-emitting element. Through the results of Table 1, it may be expected that the illuminance of each of the light-emitting elements (that are the same as the one light-emitting element) included in the display panel according to Example will be improved, and it may be seen that light extraction efficiency of the display panel including the light-emitting element may be improved.

According to a display device according to one or more embodiments of the present disclosure, light collection efficiency of light emitted from a light-emitting element included in the display device may be improved. Accordingly, the light extraction efficiency of the display device including the light-emitting element may be improved.

In the above, description has been made with reference to embodiments of the present disclosure, but those skilled in the art or those of ordinary skill in the relevant technical field may understand that one or more suitable modifications and changes may be made to the present disclosure within the scope not departing from the spirit and the technology scope of the present disclosure described in the following claims. Therefore, the technical scope of the present disclosure is not limited to the contents described in the detailed description of the specification, but should be determined by the claims and their equivalents.

What is claimed is:

1. A display device comprising:
a display panel;
a sensor layer on the display panel; and
a light control layer on the sensor layer, the light control layer comprising at least one of a dye or a pigment,
wherein the display panel comprises:
a base layer,
a pixel-defining film on the base layer, the pixel-defining film having an opening defined therein,
a light-emitting element comprising a light-emitting layer in the opening,
an inorganic deposition layer on the light-emitting element,
a low refractive pattern layer on the pixel-defining film, and
an encapsulation layer on the low refractive pattern layer and the inorganic deposition layer, and
wherein the encapsulation layer has a higher refractive index than the low refractive pattern layer.

2. The display device of claim 1, wherein the display panel is divided into a display region in which the light-emitting element is provided, and a non-display region adjacent to the display region,
the display panel further comprises a spacer in the non-display region, and
the low refractive pattern layer comprises a same material as the spacer.

3. The display device of claim 1, wherein the inorganic deposition layer comprises at least one selected from the group consisting of bismuth (Bi), ytterbium (Yb), and combinations thereof.

4. The display device of claim 1, wherein the light control layer comprises at least one selected from the group consisting of an anthraquinone-based compound, a phthalocyanine-based compound, an azo-based compound, a perylene-based compound, a xanthene-based compound, a dimonium-based compound, a dipyrromethene-based compound, a tetraazaporphyrin-based compound, a porphyrin-based compound, a squarylium-based compound, an oxazine-based compound, a triarylmethane-based compound, a cyanine-based compound, and combinations thereof.

5. The display device of claim 1, wherein the at least one of the dye or the pigment comprised in the light control layer has a maximum absorption wavelength in a wavelength range of about 490 nm to about 505 nm, and about 585 nm to about 600 nm.

6. The display device of claim 1, wherein the light-emitting element further comprises:
a first electrode on the base layer;
a second electrode apart from the first electrode with the light-emitting layer therebetween;
a hole transport region between the first electrode and the light-emitting layer;
an electron transport region between the second electrode and the light-emitting layer; and
a capping layer on the second electrode.

7. The display device of claim 6, wherein a part of the capping layer is on the pixel-defining film, and the low refractive pattern layer is directly on the capping layer.

8. The display device of claim 6, wherein a part of the second electrode is on the pixel-defining film, and the low refractive pattern layer is directly on the second electrode.

9. The display device of claim 1, wherein the low refractive pattern layer is directly on the pixel-defining film.

10. The display device of claim 1, wherein a part of the inorganic deposition layer is on the pixel-defining film, and the low refractive pattern layer is directly on the inorganic deposition layer.

11. The display device of claim 1, wherein an angle between a side surface of the pixel-defining film and an upper surface of the base layer is about 60° to about 85°, and the pixel-defining film has a thickness of about 1.5 μm to about 2 μm.

12. The display device of claim 1, wherein an angle between a side surface of the low refractive pattern layer and an upper surface of the base layer is about 70° to about 88°, and the low refractive pattern layer has a thickness of about 3 μm to about 4.5 μm.

13. The display device of claim 1, wherein the encapsulation layer comprises at least one organic encapsulation layer, and the organic encapsulation layer has a higher refractive index than the low refractive pattern layer.

14. The display device of claim 13, wherein a difference between a refractive index of the organic encapsulation layer and a refractive index of the low refractive pattern layer is about 0.1 or more.

15. The display device of claim 1, wherein the low refractive pattern layer has a refractive index of about 1.45 to about 1.65, and the encapsulation layer has a refractive index of about 1.75 to about 2.

16. The display device of claim 1, wherein the sensor layer comprises:

a sensor base layer on the encapsulation layer;
a first conductive layer on the sensor base layer;
an inorganic insulating layer on the first conductive layer;
a second conductive layer on the inorganic insulating layer; and
an organic insulating layer on the second conductive layer, and
the first conductive layer and the second conductive layer each overlap the pixel-defining film in a plan view.

17. A display device comprising:

a display panel; and
a light control layer on the display panel, the light control layer comprising at least one of a dye or a pigment,
wherein the display panel comprises:
a base layer,
a pixel-defining film on the base layer, and having an opening defined therein,
a light-emitting element comprising a light-emitting layer in the opening,
an inorganic deposition layer on the light-emitting element,
a low refractive pattern layer on the pixel-defining film, and
an encapsulation layer on the low refractive pattern layer and the inorganic deposition layer,
an angle between a side surface of the pixel-defining film and an upper surface of the base layer is about 60° to about 85°, and
an angle between a side surface of the low refractive pattern layer and the upper surface of the base layer is about 70° to about 88°.

18. The display device of claim 17, wherein the low refractive pattern layer has a refractive index of about 1.45 to about 1.65, and the encapsulation layer has a refractive index of about 1.75 to about 2.

19. A display device comprising:

a display panel; and
a sensor layer on the display panel,
wherein the display panel comprises:
a base layer,
a pixel-defining film on the base layer, and having an opening defined therein,
a light-emitting element comprising a light-emitting layer in the opening,
a low refractive pattern layer on the pixel-defining film, and
an encapsulation layer on the low refractive pattern layer,
the encapsulation layer has a higher refractive index than the low refractive pattern layer, and
an angle between a side surface of the low refractive pattern layer and an upper surface of the base layer is about 70° to about 88°.

20. The display device of claim 19, further comprising a light control layer on the sensor layer, wherein the light control layer comprises at least one selected from the group consisting of an anthraquinone-based compound, a phthalocyanine-based compound, an azo-based compound, a perylene-based compound, a xanthene-based compound, a dimonium-based compound, a dipyrromethene-based compound, a tetraazaporphyrin-based compound, a porphyrin-based compound, a squarylium-based compound, an oxazine-based compound, a triarylmethane-based compound, a cyanine-based compound, and combinations thereof.

* * * * *